United States Patent [19]
Noguchi et al.

[11] Patent Number: 5,828,084
[45] Date of Patent: Oct. 27, 1998

[54] HIGH PERFORMANCE POLY-SIGE THIN FILM TRANSISTOR

[75] Inventors: Takashi Noguchi, Atsugi, Japan; Rafael Reif, Newton; Julie Tsai, Belmont, both of Mass.; Andrew J. Tang, Arlington, Tex.

[73] Assignees: Sony Corporation, Japan; Massachusetts Institute of Technology, Cambridge, Mass.

[21] Appl. No.: 411,203

[22] Filed: Mar. 27, 1995

[51] Int. Cl.$^6$ .............................. H01L 29/04; H01L 29/76
[52] U.S. Cl. .................................. 257/65; 257/55; 257/66
[58] Field of Search .................................. 257/65, 66, 55

[56] References Cited

U.S. PATENT DOCUMENTS 5,461,250  10/1995  Burghartz et al. ........................ 257/66

OTHER PUBLICATIONS

High–Mobility GeSi PMOS and SIMOX, IEEE Electron Device Letters, vol. 14, No. 11, Nov. 1993; Effects of GE on Material and Electrical Properties of Polycrystalline $Si_1$–Ge For TFT Applications; Julie A. Tsai, MIT, 1994 Fall Mtg of The Electrochemical Soc.

Fabrication of Polycrystalline $Si_{i-}$ Ge Films on Oxide For Thin–Film Transistors, Julie Tsai, MIT.

A Low Temperature Silicon–Germanium MOS Thin–Film Transistor Technology for Large–Area Electronics, 1991 IEEE, Tsu–Jae King and Krishna C. Saraswat.

Applications of Polycrystalline Silicon–Germanium Thin Films in Metal Oxide Semiconductor Technologies; Tsu–Jae King, Mar. 1994, Technical Report No. ICL 94–031.

*Primary Examiner*—Valencia Martin Wallace
*Attorney, Agent, or Firm*—Ronald P. Kananen

[57] ABSTRACT

The present invention pertains to a high-performance thin film transistor having a gate and an active region, whose active region comprises a poly-$Si_{1-x}Ge_x$ alloy material and a channel layer of silicon, in which the channel layer of silicon is interposed between the poly-$Si_{1-x}Ge_x$ alloy material and the gate, and a method for fabricating such a high-performance thin film transistor.

20 Claims, 9 Drawing Sheets

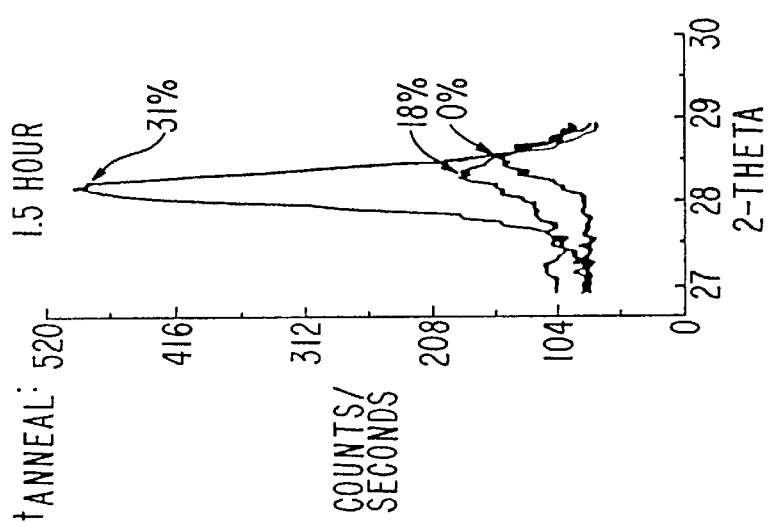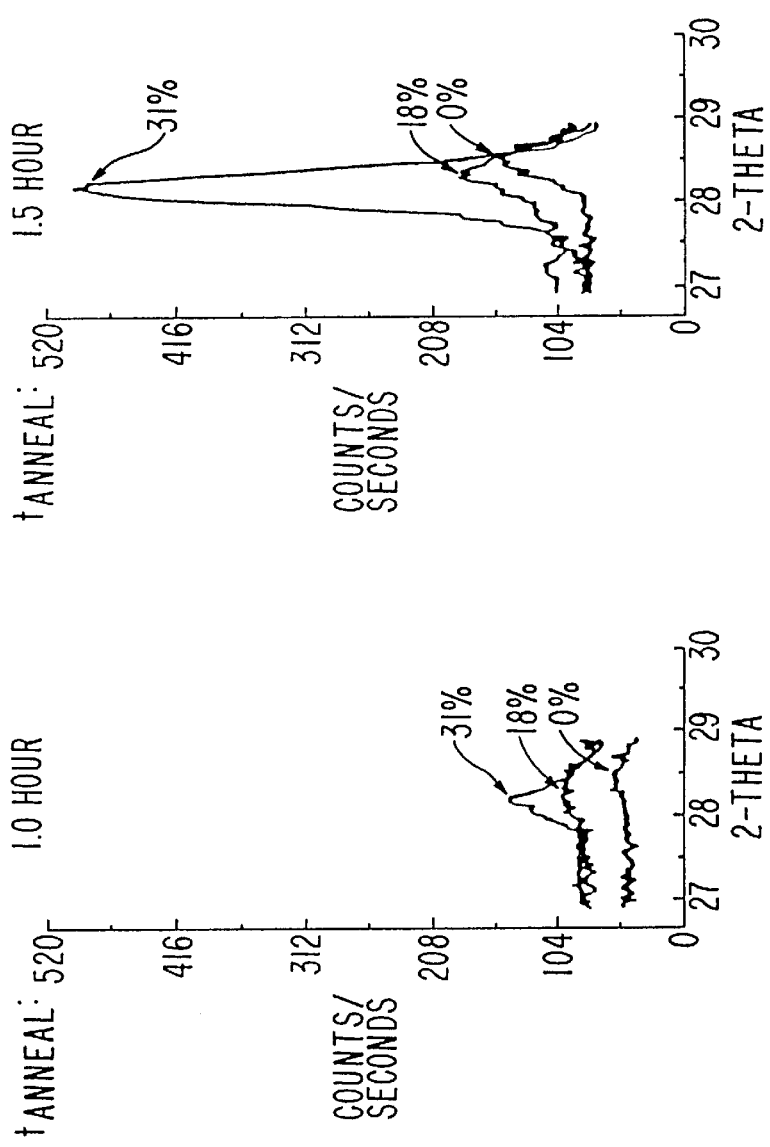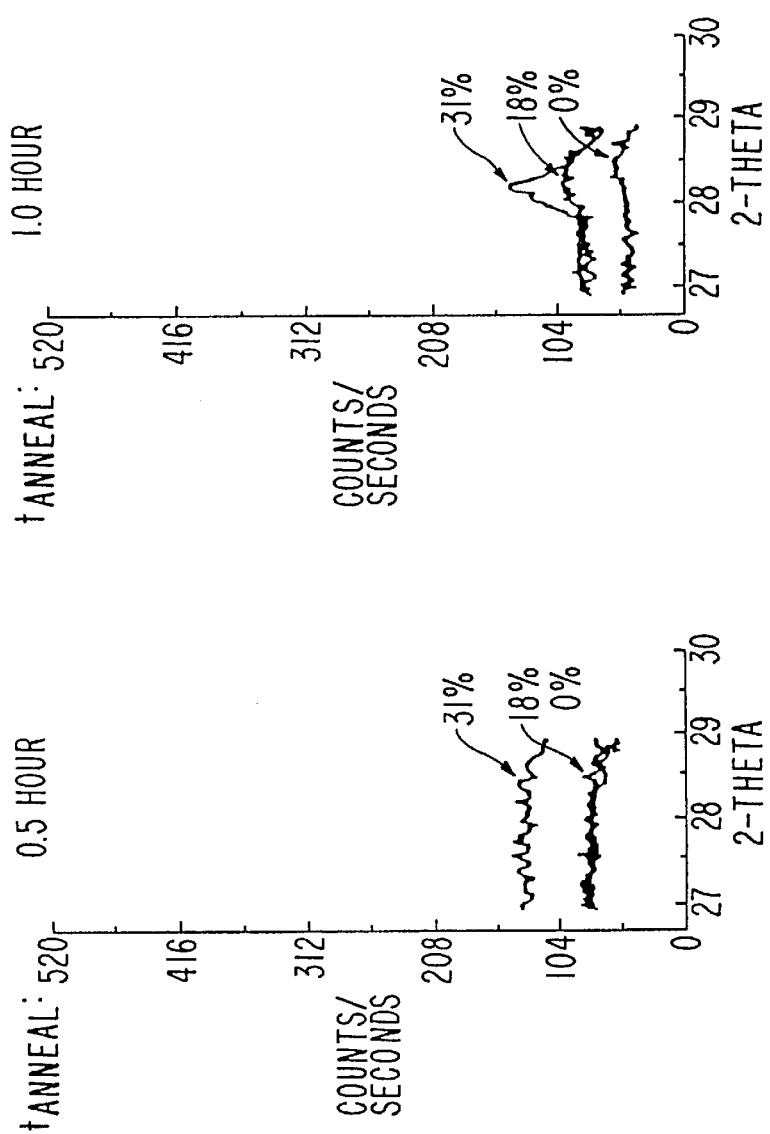

1

HIGH PERFORMANCE POLY-SIGE THIN FILM TRANSISTOR

BACKGROUND OF THE INVENTION

1 Field of the Invention

The present invention pertains to a novel high-performance thin film transistor having an active region and a gate, whose active region comprises a poly-$Si_{1-x}Ge_x$ alloy material and a channel layer of silicon, in which the channel layer of silicon is interposed between the poly-$Si_{1-x}Ge_x$ alloy material and the gate and a method for fabricating such a high-performance thin film transistor.

2. Discussion of the Background

Conventional thin-film transistors (TFTs) are commonly employed in high-density static random access memory cells (SRAMs) for load pull-up devices, as well as used both as switching elements and as peripheral driver circuitry in large-area active-matrix liquid crystal displays (LCDs). In such conventional thin film transistors, polycrystalline silicon (poly-Si) is widely used as the active region. Unfortunately, the performance of a poly-Si TFT degrades substantially as the processing temperature decreases. This performance degradation removes many of the incentives to use a poly-Si TFT, because low-temperature processing is necessary in SRAM fabrication to preserve the underlying dopant profiles and to allow for less expensive glass substrates in LCD manufacture.

To overcome these limitations regarding poly-Si TFTs, poly-$Si_{1-x}Ge_x$ materials have been employed in the low temperature manufacture of thin film transistors. Such transistors are described in King, *Applications of Polycrystalline Silicon-Germanium Thin Films in Metal-Oxide-Semiconductor Technologies,* Technical Report No. ICL 94-031 (1994); King et al., IEDM, 91, 567 (1991); and King, *IEEE Electron Device Letters,* 13, 309 (1992). However, in these thin film transistors, while a poly-$Si_{1-x}Ge_x$ material is employed as the active region, a channel layer of silicon is not interposed between the poly-$Si_{1-x}Ge_x$ alloy material and the gate. As these investigators themselves noted, the performance of such poly-$Si_{1-x}Ge_x$ TFTs was not superior to that of the poly-Si TFTs. Moreover, experiments performed by the present inventors indicated that the interface trap state density as calculated from the measured subthreshold slope is not improved in a poly-$Si_{1-x}Ge_x$ TFT relative to poly-Si TFT, and, in the case of an NMOS poly-$Si_{1-x}Ge_x$ TFT is significantly diminished.

In an attempt to construct a poly-$Si_{1-x}Ge_x$ TFT whose performance would match or exceed that of poly-Si TFTs, an investigation was undertaken to fabricate a superior poly-$Si_{1-x}Ge_x$ TFT. Hypothesizing that a very-thin-film silicon layer interposed between a poly-$Si_{1-x}Ge_x$ alloy material and a gate, where the silicon layer is thick enough to result in a high quality poly-Si/$SiO_2$ interface and yet thin enough to allow the channel region to reside at least in part within the poly-$Si_{1-x}Ge_x$ layer, might result in a superior poly-$Si_{1-x}Ge_x$ TFT, a poly-$Si_{1-x}Ge_x$ TFT having an active region and a gate was constructed, whose active region comprises a poly-$Si_{1-x}Ge_x$ alloy material and a channel layer of silicon, in which the channel layer of silicon is interposed between the poly-$Si_{1-x}Ge_x$ alloy material and the gate. Such a TFT had not been disclosed in the prior art.

SUMMARY OF THE INVENTION

Accordingly, an object of the present invention is to provide a novel high-performance poly-$Si_{1-x}Ge_x$ thin film transistor.

It is another object of the present invention to provide a method of fabricating a high-performance poly-$Si_{1-x}Ge_x$ thin film transistor.

These objects, among others, have been obtained with a thin film transistor having an active region and a gate, whose active region comprises a poly-$Si_{1-x}Ge_x$ alloy material and a channel layer of silicon, in which the channel layer of silicon is interposed between the poly-$Si_{1-x}Ge_x$ alloy material and the gate. Such objects have also been achieved by means of a method of fabricating a poly-$Si_{1-x}Ge_x$ TFT having an active region and a gate, whose active region comprises a poly-$Si_{1-x}Ge_x$ alloy material and a channel layer of silicon, in which the channel layer of silicon is interposed between the poly-$Si_{1-x}Ge_x$ alloy material and the gate.

Such poly-$Si_{1-x}Ge_x$ thin film transistors are useful for peripheral logic circuits and pixels in active-matrix liquid crystal displays and for load devices in high density SRAMs.

BRIEF DESCRIPTION OF THE DRAWINGS

A more complete appreciation of the invention and many of the attendant advantages thereof will be readily obtained as the invention becomes better understood by reference to the following detailed description when considered in connection with the accompanying drawings, wherein:

FIGS. 5A, 5B, and 5C are three graphs depicting X-ray diffraction analyses of crystallizations at three different Ge contents for three different annealing times in $N_2$ at 600° C.

DETAILED DESCRIPTION OF THE PREFERRED EMBODIMENTS

The present invention provides a novel high-performance poly-$Si_{1-x}Ge_x$ thin film transistor having an active region and a gate, whose active region comprises a poly-$Si_{1-x}Ge_x$ alloy material and a channel layer of silicon, in which the channel layer of silicon is interposed between the poly-$Si_{1-x}Ge_x$ alloy material and the gate. In a preferred embodiment of the present invention, the thickness of the silicon channel layer is 100 Å or less, preferably 50 Å or less. In an embodiment of the present invention, the silicon channel layer is at least 2 Å thick.

The present invention also provides a novel method of constructing a high-performance poly-$Si_{1-x}Ge_x$ thin film transistor having an active region and a gate, whose active region comprises a poly-$Si_{1-x}Ge_x$ alloy material and a channel layer of silicon, in which the channel layer of silicon is interposed between the poly-$Si_{1-x}Ge_x$ alloy material and the gate.

In an embodiment of the present invention, the active region comprising a poly-$Si_{1-x}Ge_x$ alloy material and a channel layer of silicon, in which the channel layer of silicon is interposed between the poly-$Si_{1-x}Ge_x$ alloy material and the gate is constructed by treating a substrate with a source of silicon and a source of germanium, in which the source of silicon and the source of germanium are initially applied simultaneously and after a finite, non-zero time, the source of germanium is discontinued while the source of silicon is continued. In an alternate embodiment of the present invention, the active region comprising a poly-$Si_{1-x}Ge_x$ alloy material and a channel layer of silicon, in which the channel layer of silicon is interposed between the poly-$Si_{1-x}Ge_x$ alloy material and the gate is constructed by treating a substrate with a gate constructed upon the substrate with a source of silicon and, after a finite, non-zero time, a source of germanium is applied while the source of silicon is continued.

Figure 1:
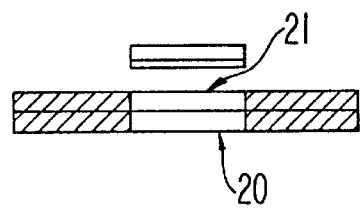
FIG. 1 is a schematic illustration of a thin film transistor with a channel layer of silicon constructed upon a poly-$Si_{1-x}Ge_x$ layer.
Figure 2:
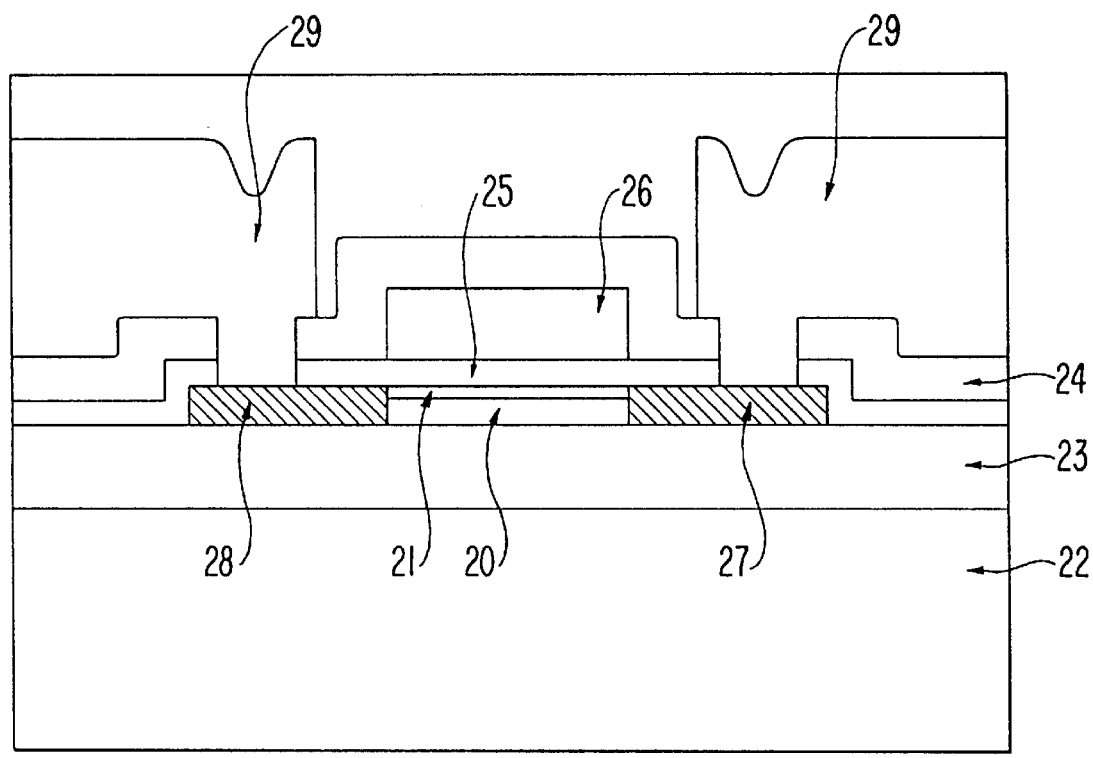
FIG. 2 shows a cross-section of a top gate thin film transistor utilizing an active region and a gate, whose active region comprises a poly-$Si_{1-x}Ge_x$ alloy material and a channel layer of silicon, in which the channel layer of silicon is interposed between the poly-$Si_{1-x}Ge_x$ alloy material and the gate.
Figure 3:
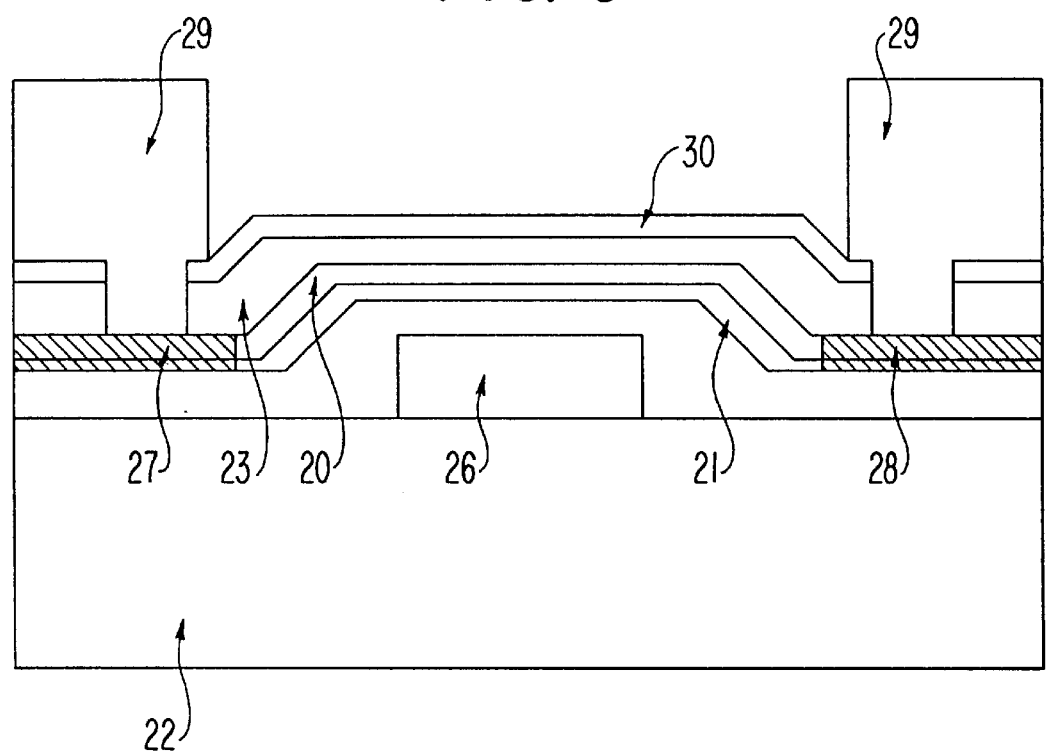
FIG. 3 shows a cross-section of a bottom gate thin film transistor utilizing an active region and a gate, whose active region comprises a poly-$Si_{1-x}Ge_x$ alloy material and a channel layer of silicon, in which the channel layer of silicon is interposed between the poly-$Si_{1-x}Ge_x$ alloy material and the gate.

Referring now to the drawings, wherein like reference numerals designate identical or corresponding parts throughout the several views, and more particularly to FIGS. 1, 2, and 3, numeral 20 designates the poly-$Si_{1-x}Ge_x$ alloy material; numeral 21 designates the silicon channel layer; numeral 22 designates the substrate, which can be either a silicon substrate, a silicon oxide substrate, or glass; numeral 23 designates an isolation oxide layer; numeral 24 designates an LTO passivation layer; numeral 25 designates an LTO gate oxide; numeral 26 designates a gate; numeral 27 designates a source region; numeral 28 designates a drain region; numeral 29 designates a metallized region; and numeral 30 designates a SiN layer.

In an alternate embodiment of the present invention, the active region comprising a poly-$Si_{1-x}Ge_x$ alloy material and a channel layer of silicon, in which the channel layer of silicon is interposed between the poly-$Si_{1-x}Ge_x$ alloy material and the gate, is constructed by initially treating a substrate with a source of silicon and a source of germanium, which are applied simultaneously, and subsequently treating the material with a source of silicon.

In a preferred embodiment of the present invention, this initial treatment and this subsequent treatment occur in a single reaction chamber without exposure to air between these two treatments. This successive deposition is carried out in the absence of air so as to prevent the formation of an oxide layer between the poly-$Si_{1-x}Ge_x$ alloy material and a channel layer of silicon. In a less preferred embodiment of the present invention, this initial treatment and this subsequent treatment occur in two separate reaction chambers.

For example, in the construction of a top gate thin film transistor as depicted in FIG. 2, a thermal isolation oxide layer is applied to a substrate. The substrate can be either a silicon substrate or glass, for example, a sodium-free, heat-proof glass, such as Asahi 635 glass or Corning 7059 low mp glass. To the isolation oxide layer is applied the poly-$Si_{1-x}Ge_x$ alloy material. In an alternate embodiment of the present invention, an isolation oxide layer is not applied and the poly-$Si_{1-x}Ge_x$ alloy material is applied directly to the substrate. Upon the poly-$Si_{1-x}Ge_x$ alloy material is applied a silicon layer to form a composite. The composite is then treated either by solid phase crystallization or excimer laser annealing. The treated composite is then patterned and etched. Upon the etched material is then applied a LTO gate insulator and a gate is then deposited. The gate is then patterned and etched. The gate, source and drain regions are then ion-implanted and the ion-implants are annealed. A LTO passivation layer is then deposited and the contact holes are patterned and etched. The material is then metallized and the metallization is patterned and etched. Finally, the material is sintered.

In another embodiment of the present invention, the active region comprising a poly-$Si_{1-x}Ge_x$ alloy material and a channel layer of silicon, in which the channel layer of silicon is interposed between the poly-$Si_{1-x}Ge_x$ alloy material and the gate, is constructed by initially treating a substrate with a source of silicon and subsequently treating the material with a source of silicon and a source of germanium, which are applied simultaneously.

In a preferred embodiment of the present invention, this initial treatment and this subsequent treatment occur in a single reaction chamber without exposure to air between these two treatments. This successive deposition is carried out in the absence of air so as to prevent the formation of an oxide layer between the poly-$Si_{1-x}Ge_x$ alloy material and a channel layer of silicon. In a less preferred embodiment of the present invention, this initial treatment and this subsequent treatment occur in two separate reaction chambers.

As another example, in the construction of a bottom gate thin film transistor as depicted in FIG. 3, a gate is formed upon a substrate. The substrate can be either a silicon substrate, such as a C-Si substrate, or glass, for example, Corning 7059 low mp glass. The gate can be formed, for example, by sputtering Co as in LCD, or by LPCVD deposition of poly-Si as in an SRAM. To the substrate to which a gate has been deposited is then applied a silicon oxide layer. To the deposited silicon oxied layer is then a silicon layer. To the silicon layer is then applied the poly-$Si_{1-x}Ge_x$ alloy material to form a composite. The composite is then treated either by solid phase crystallization or excimer laser annealing. The treated composite is then patterned and etched. The gate, source and drain regions are then ion-implanted and the ion-implants are annealed. A LTO passivation layer is then deposited and the contact holes are patterned and etched. The material is then metallized and the metallization is patterned and etched. Finally, the material is sintered.

In an embodiment of the present invention, the source of silicon and the source of germanium can be regulated by means of valves controlled by a microprocessor to achieve the desired proportion of Ge in the poly-$Si_{1-x}Ge_x$ alloy material and to construct the proper sequence of the poly-$Si_{1-x}Ge_x$ alloy material and the channel layer of silicon.

Suitable sources of silicon include silane ($SiH_4$) and disilane ($SiH_6$). A suitable source of germanium includes $GeH_4$.

After construction of the active region comprising a poly-$Si_{1-x}Ge_x$ alloy material and a channel layer of silicon, in which the channel layer of silicon is interposed between the poly-$Si_{1-x}Ge_x$ alloy material and the gate, the resultant composite is crystallized/annealed by at least one process selected from the group consisting of solid phase crystallization and excimer laser annealing. Excimer laser annealing is an annealing process employing a laser containing a noble gas, such as helium or neon, which achieves stimulated emission of radiation by means of a transition between an excited state of the noble gas, in which a metastable bond exists between two gas atoms, and a rapidly dissociating ground state.

In another preferred embodiment of the present invention, the poly-$Si_{1-x}Ge_x$ active region contains Ge in a range from 0.05 atomic % to 0.40 atomic %. Accordingly, the Si content of the poly-$Si_{1-x}Ge_x$ active region will range from 0.60 atomic % to 0.95 atomic %. In a particularly preferred embodiment, the poly-$Si_{1-x}Ge_x$ active region contains Ge in a range from 0.10 atomic % to 0.30 atomic %. In a most particularly preferred embodiment, the poly-$Si_{1-x}Ge_x$ active region contains Ge at 0.20 atomic %. The thickness of the poly-$Si_{1-x}Ge_x$ active region can vary from 100 Å to 1500 Å, preferably 100 Å to 1000 Å.

Other features of the invention will become apparent in the course of the following descriptions of exemplary embodiments which are given for illustration of the invention and are not intended to be limiting thereof.

EXAMPLE 1

A silicon wafer of thermally grown $SiO_2$ is used for the starting substrate. An active layer of poly-$Si_{1-x}Ge_x$ is deposited on the substrate and subsequently a silicon layer is deposited on top of the poly-$Si_{1-x}Ge_x$ layer to form a composite. In an alternate embodiment of the present invention, a thermal isolation oxide layer is deposited on the substrate prior to deposition of the poly-$Si_{1-x}Ge_x$ layer. In a preferred embodiment of the present invention, the poly-$Si_{1-x}Ge_x$ layer is 150 nm thick.

This composite is then crystallized/annealed by either solid phase crystallization or excimer laser annealing. In one embodiment, the solid phase crystallization is carried out at 600° C. in $N_2$ for 55 hours.

The active regions are then defined by patterning and plasma etching and a low temperature oxide (LTO) gate insulator is deposited. In an embodiment of the present invention, the LTO gate insulator is 100 nm thick. In an alternate embodiment of the present invention, a $SiO_2$ layer is deposited upon the poly-$Si_{1-x}Ge_x$ silicon composite.

Then a poly-Si gate is deposited and the gate is patterned and plasma etched. In an embodiment of the present invention, the poly-Si gate is 300 nm thick.

At this point the gate, source, and drain regions are implanted. For an n-type TFT, the regions are implanted with $P^+$ at 2e15 $cm_{-2}$ and 110 keV; while for a p-type TFT, the regions are implanted with $B^+$ at 2e15 $cm_{-2}$ and 25 keV. The implants are then annealed at 600° C. in $N_2$. For an n-type TFT, the regions are annealed for 65 hours; while for a p-type TFT, the regions are annealed for 3 hours.

Subsequently, a passivation LTO is deposited and the contact holes are patterned and plasma etched. In an embodiment of the present invention, the passivation LTO is 300 nm thick.

The structure is then metallized and the metal is patterned and plasma etched. In an embodiment of the present invention, the metallization results in deposition of a 1 μm thick layer of Al-1%Si.

Finally, the structure is sintered in forming gas. In a preferred embodiment of the present invention, the sintering is performed at 400° C. for 20 minutes using 15% $H_2$ as the forming gas.

To demonstrate the improved characteristics of a TFT employing a poly-$Si_{1-x}Ge_x$ alloy material, the present inventors ran the following experiments.

EXAMPLE 2

A very-low-pressure CVD reactor having RF plasma-enhancement capability (PE-VLPCVD) was employed as described in J. A. Tsai and R. Reif, Mechanisms of Thin Film Evolution, S. M. Yalisove, C. V. Thompson, and D. J. Eaglesham, eds. *Materials Research Society Proceedings*, 317, 603 (1994). This system is a single-wafer lamp-heated cold-wall reactor with a low base pressure ($1 \times 10^{-8}$ T) and low operating pressures $\leq 4$ mT. Using SiH4 and $GeH_4$ gases, $Si_{1-x}Ge_x$ thin films of 1000 Å average thickness were grown either thermally or with plasma-enhanced deposition on oxide-coated Si(100) substrates at temperatures between 400° C. and 600° C. To assist the growth of thermal $Si_{1-x}Ge_x$ on oxide, a brief plasma deposition of Si served to provide a buffer layer for subsequent thermal growth; in another embodiment, the $Si_{1-x}Ge_x$ films were grown completely by plasma-enhanced deposition with 4W of plasma power.

To measure the properties of the blanket (PE–) VLPCVD $Si_{1-x}Ge_x$ films on oxide substrate, various structural characterization techniques were employed, including Rutherford backscattering spectrometry (RBS) to measure Ge content and growth rates, X-ray diffraction (XRD) analysis to measure crystallinity and film texture, and plan-view and cross-sectional transmission electron microscopy (TEM) analyses to measure grain sizes and grain structure.

The resistivities of the poly-$Si_{1-x}Ge_x$ films were characterized using four-point probe measurements on implanted blanket films. In addition to the PE-VLPCVD films, $Si_{1-x}Ge_x$ films were also grown by a modified conventional LPCVD system. These films, in some cases capped with 1000 Å low-temperature deposited oxide (LTC), were implanted with 2e15 $cm^{-2}$ of $BF_2$ or P+ and then subsequently annealed in an ambient $N_2$ atmosphere at either 600° C. for 15 hours or 950° C. for 20 minutes.

Hall effect measurements were performed on patterned structures using a magnetic field of 0.32 Tesla to evaluate carrier mobilities as a function of Ge content in poly-$Si_{1-x}Ge_x$ films. Greek cross structures were formed on 1000 Å amorphous-$Si_{1-x}Ge_x$ films plasma-deposited at 400° C. over oxide-coated Si substrates. For comparison, the same structures were also formed in amorphized LPCVD $Si_{1-x}Ge_x$ films. All films were then annealed at 600° C. in $N_2$ for 65 hours to undergo solid phase crystallization (SPC). Following SPC, the films were implanted with 1e15 $cm^{-2}$ B+ or P+ with the implant peak targeted at the film center. After an implant anneal in $N_2$ at 600° C., the films were patterned, passivated with LTO, sputtered with Al-1%Si metallization, and then sintered at 400° C. in forming gas.

Both p-type and n-type top-gate poly-$Si_{1-x}Ge_x$ were fabricated to evaluate field-effect mobilities in poly-$Si_{1-x}Ge_x$. Starting with 1500 Å of 550° C. LPCVD $Si_{0.9}Ge_{0.1}$ formed on oxide-coated Si substrates, the films were amorphized by 2e15 $cm^{-2}$ Si+ implantation and solid-phase crystallized (SPC) at 600° C. in $N_2$ for 55 hours. Active-layer islands were etched, followed by depositions of a 1000 Å LTO gate insulator and a 3000 Å poly-Si gate electrode. After gate definition, self-aligned source/drain and gate regions were implanted with 2e15 $cm^{-2}$ B for p-type and 2e15 $CM^{-2}$ P for n-type; activation anneals of 3 hours for p-channel devices and 65 hours for n-channel devices were performed at 600° C. in $N_2$. Contact holes were defined in an LTO passivation layer, and, finally, 1 μm Al-1%Si metallization was sputter-deposited, patterned, and then sintered in forming gas.

Figure 4:
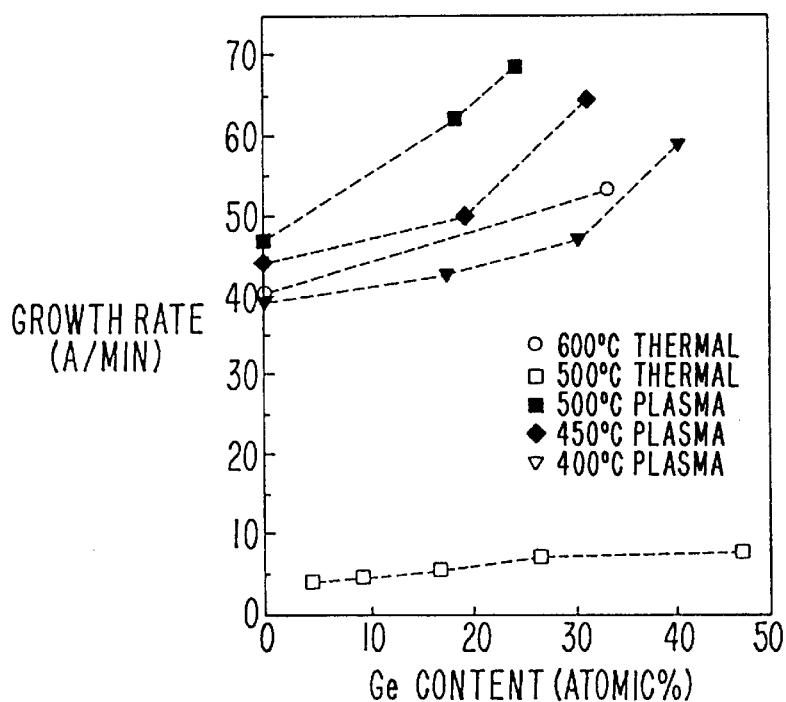
FIG. 4 is a graph of the growth rate of a poly-$Si_{1-x}Ge_x$ film relative to its Ge content.

The deposition rates as a function of Ge content in $Si_{1-x}Ge_x$ films grown by (PE-)VLPCVD are illustrated in FIG. 4. For both thermal growth and plasma-enhanced deposition at a fixed temperature, the deposition rates are enhanced as the Ge content in the film increases. This may be attributed to $GeH_4$ acting as a catalyst to enhance hydrogen desorption from the growth surface, analogous to the kinetics in heteroepitaxial $Si_{1-x}Ge_x$. Relative to thermal growth, however, plasma-enhanced deposition at 500° C. increases growth rates by an order of magnitude and appears to further increase the catalytic nature of $GeH_4$. In this case, it is believed that the plasma process induces the Ge atoms to act as more efficient hydrogen desorption sites by means of a lowering of the activation energy required for surface desorption.

TABLE 1

| $T_{ieposition}$ | mode | Ge content z | |
|---|---|---|---|
| | | z = 0 | z ≧ 0 |
| 600° C. | thermal | poly | poly |
| 500° C. | thermal | amorph | poly |
| 500° C. | plasma | amorph | poly |
| 450° C. | plasma | amorph | amorph |
| 400° C. | plasma | amorph | amorph |

Table 1 lists the crystalline form (i.e., polycrystalline or amorphous) of films deposited at various temperatures achieved either thermally or by means of plasma enhanced deposition, as determined by XRD analysis and verified by plan-view TEM. At 600° C., thermal growth of both Si and $Si_{1-x}Ge_x$ films results in the polycrystalline form, up to the highest investigated Ge content of 42%. In contrast, at 500° C. Si is deposited amorphously, while $Si_{1-x}Ge_x$ films of all Ge contents by weight remain polycrystalline; moreover, this was observed for both thermal and plasma-enhanced depositions. This suggests that the transition temperature between polycrystalline and amorphous deposition is lowered by the addition of Ge, a phenomenon resulting from the lower melting point of intrinsic Ge relative to Si. At the lower temperatures of 450° C. and 400° C., all plasma-deposited Si and $Si_{1-x}Ge_x$ films investigated (Ge content ≦32%) were deposited in amorphous form.

The crystallization of PE-VLPCVD amorphous $Si_{1-x}Ge_x$ films at 600° C. in $N_2$ was analyzed by XRD as a function of annealing time and the results are presented in FIGS. 5A, 5B, and 5C. The annealing times required by crystallization are of the order of a few hours, much smaller than the tens of hours typically reported for 600° C. crystallization of amorphized conventional LPCVD poly-Si films, for example as discussed in I-W. Wu, A. Chang, M. Fuse, L. Ovecoglu, and T. Y. Huang, *J. Appl. Phys.*, 65, 4036 (1989). Because the PE-VLPCVD films are deposited at lower pressures and, accordingly, have less contamination, the crystallization process is not impeded by impurity drag. Therefore, the effects of Ge on the crystallization process are observed in a shorter time. With increasing time, X-ray peaks develop and intensify, occurring faster for the higher Ge-content films. Thus, the presence of Ge appears to enhance the crystallization process. Since the polycrystalline-to-amorphous transition temperature is lower for $Si_{1-x}Ge_x$ than Si, amorphous $Si_{1-x}Ge_x$ deposited at 400° C. is believed to have more nascent nuclei prior to crystallization than amorphous Si deposited at the same temperature, resulting in enhanced nucleation.

Figure 6:
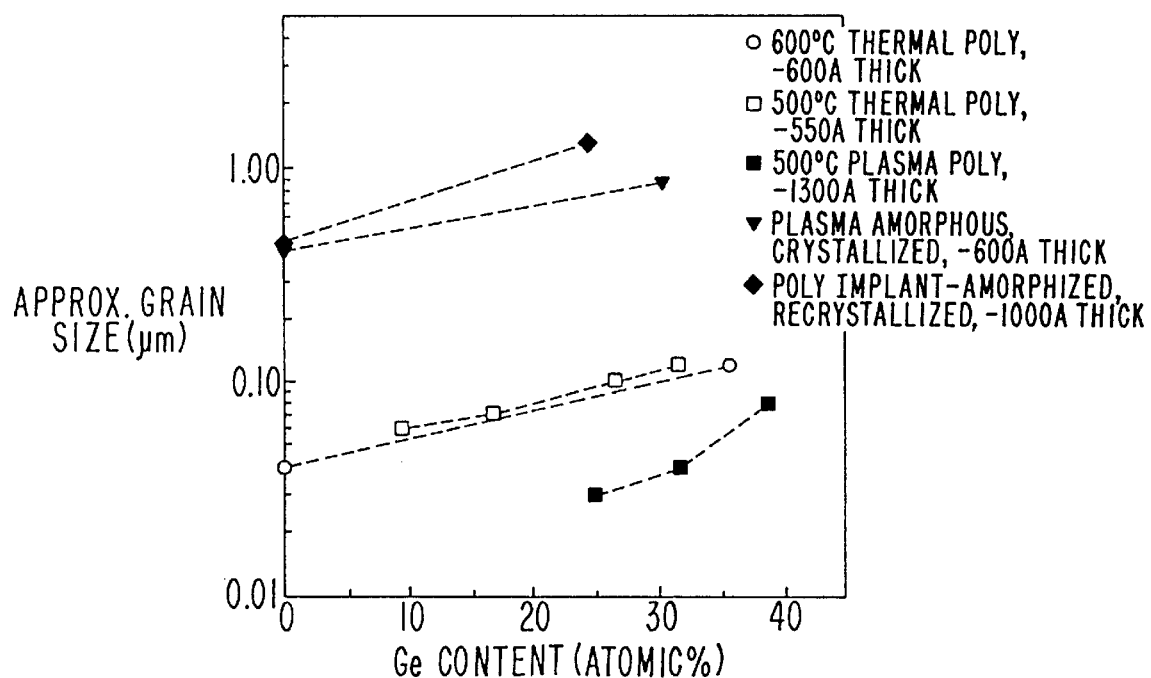
FIG. 6 is a graph of grain size as a function of Ge content.

Fully crystallized films after 600° C. 15-hour SPC annealing of initially amorphous material had an average grain size of 0.87 $\mu$m for the undoped poly-$Si_{0.69}Ge_{0.31}$ and 0.40 $\mu$m for the undoped poly-Si. In fact, poly-$Si_{1-x}Ge_x$ films formed by a variety of methods all showed enlarged grain size with increasing Ge content, as illustrated in FIG. 6. Plasma-deposited poly-$Si_{1-x}Ge_x$ films have grains smaller by a factor of about 3 relative to the thermally-grown poly-$Si_{1-x}Ge_x$ films. Such grain size reduction results from the generation of a higher concentration of initial nuclei by the plasma process, resulting in smaller final grain sizes. However, plasma deposition of amorphous films at 400° C. with subsequent crystallization at 600° C. results in a grain size enlarged by more than a factor of 20 relative to plasma deposition of polycrystalline films. The largest $Si_{1-x}Ge_x$ grain size observed was 1.3 $\mu$m, formed by Si+ implant-amorphization of a polycrystalline film with subsequent recrystallization at 600° C.

For a given deposition mode and/or processing temperature, the nucleation and growth of a $Si_{1-x}Ge_x$ alloy appears to be more effective relative to Si, perhaps due to the lower melting point of Ge. This results not only in a higher concentration of nuclei in the amorphous phase, but also, and perhaps more importantly, a higher effective growth temperature, producing higher growth rates. Hence, $Si_{1-x}Ge_x$ grain sizes increase with Ge content. Si+ implant-amorphization with subsequent recrystallization, also illustrated in FIG. 6, appears to be more sensitive to Ge-induced grain size enhancement compared to amorphous deposition with crystallization. This could result from Si+ implantation reducing the density of nucleation sites, since the heavier-mass Ge atoms displaced by ion bombardment may suppress nucleation, yielding larger final $Si_{1-x}Ge_x$ grain sizes.

Doped poly-Si films are widely utilized in current Si processing and integrated circuit technologies for applications such as gate electrodes, diffusion sources, and interconnects in VLSI circuit, in additional to TFTs. In such applications, very low resistivities are necessary for increased circuit speed. However, lowering the film resistivities by increasing the concentration of dopant eventually reaches a limit resulting from carrier scattering and dopant solubility.

Figure 7:
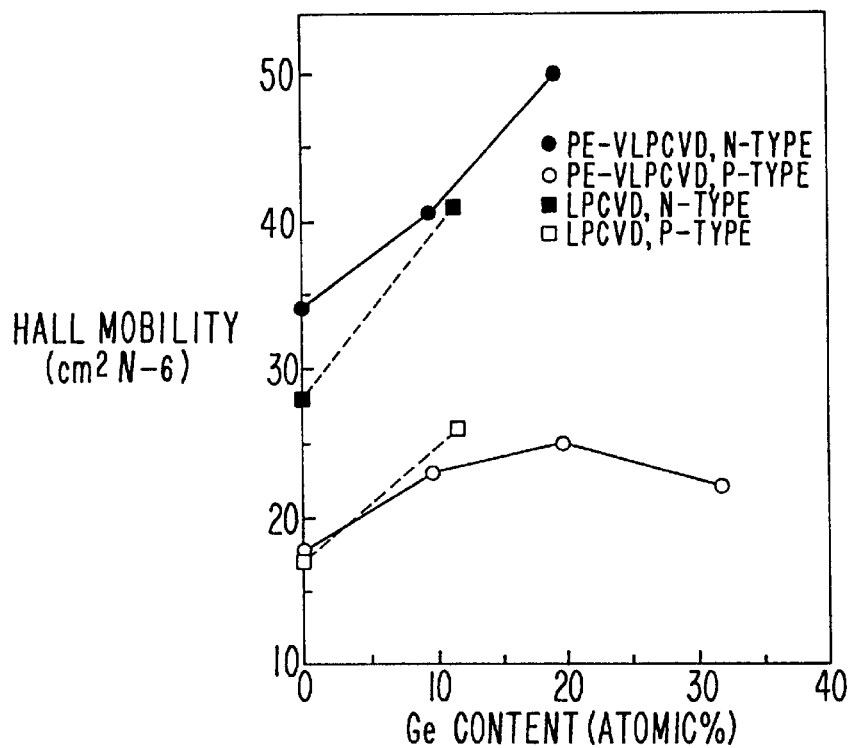
FIG. 7 is a graph of Hall mobility as a function of Ge content (atomic %).

Hall measurements were performed on patterned test structures and the Hall effect mobilities in n-type and p-type poly-$Si_{1-x}Ge_x$ films implanted with 1e15 $cm^{-2}$ p+- or B+, respectively, are illustrated in FIG. 7. The data includes both PE-VLPCVD and LPCVD films, which exhibit similar behavior as a function of Ge content. In all cases, the Hall mobilities of poly-$Si_{1-x}Ge_x$ films are greater than those of the corresponding poly-Si films, with a maximum observed value of 50 $cm^2$/V-sec for 20% Ge in n-type material. This increased Hall mobility is monotonic with Ge content up to 20% Ge; beyond this value, one data point for p-type poly-$Si_{1-x}Ge_x$ shows a decreased Hall mobility. The initial increase in mobility with Ge content observed in all film types is perhaps attributable to alloying of poly-Si with Ge, a higher bulk-mobility material. The increase may also be attributed, at least in part, to an enhancement in grain size. The drop in mobility observed in the p-type film at the highest Ge content is believed to result from alloy scattering caused by excessive Ge or, perhaps, Ge segregation at the grain boundaries which could act as a trap for holes. The increased mobility observed in poly-$Si_{1-x}Ge_x$ (x≦20%) can lead to increased drive current in TFTs which is important for faster peripheral drive circuitry in LCDs.

Figure 8:
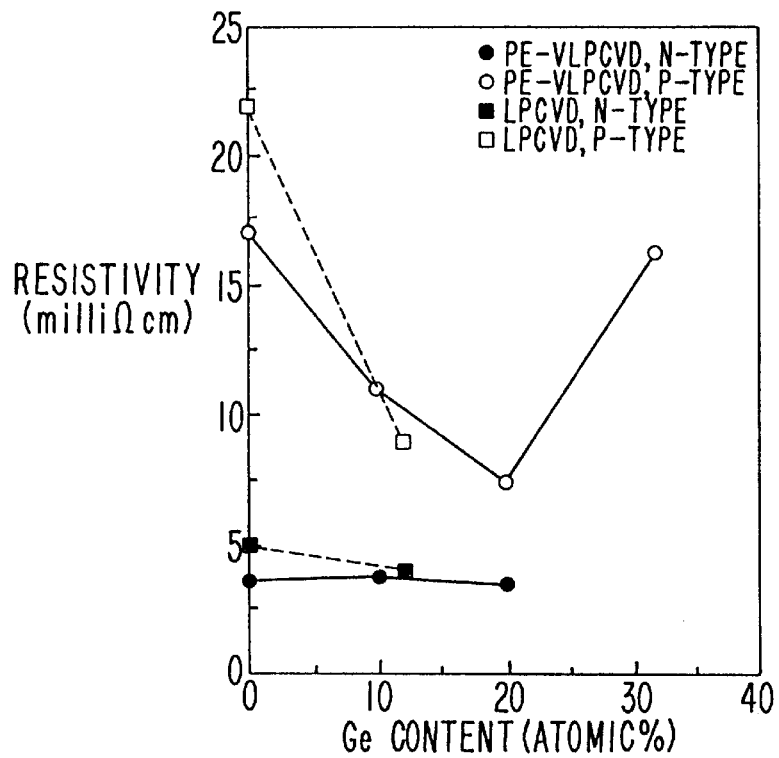
FIG. 8 illustrates Hall effect resistivities as a function of Ge content (atomic %).

The resistivities derived from the Hall effect measurements are shown in FIG. 8. These resistivities generally decrease with increasing Ge content, similar to the resistivities measured on blanket films by four-point probe, despite different dopant implant doses. The one anomaly is the p-type film at a 32% Ge content, in which the resistivity has increased relative to the film at a Ge content of 20%. In this case, the dopant activation percentage has also dropped. It is believed that increased Ge content in the alloy results in greater segregation of the implanted boron at the grain boundaries, thus lowering the percent dopant activation, increasing resistivity, and lowering mobility.

Figure 9A:
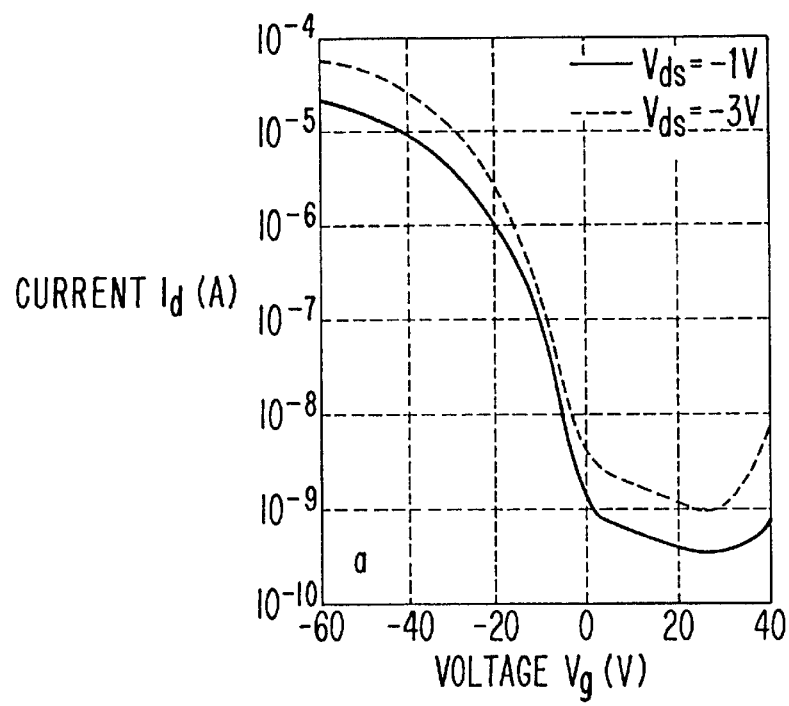
FIGS. 9A and 9B are graphs depicting current as a function of voltage for a PMOS poly-$Si_{1-x}Ge_x$ TFT and a NMOS poly-$Si_{1-x}Ge_x$ TFT, respectively, wherein W=L=0.5 $\mu$m and the thickness of the poly-$Si_{1-x}Ge_x$ is 1500 Å.
Figure 9B:
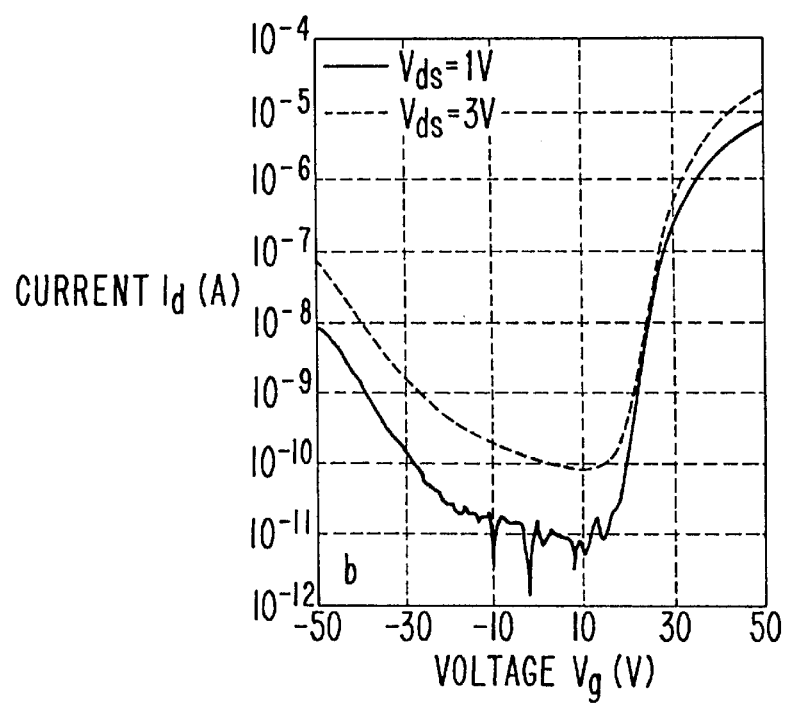
Figure 10A:
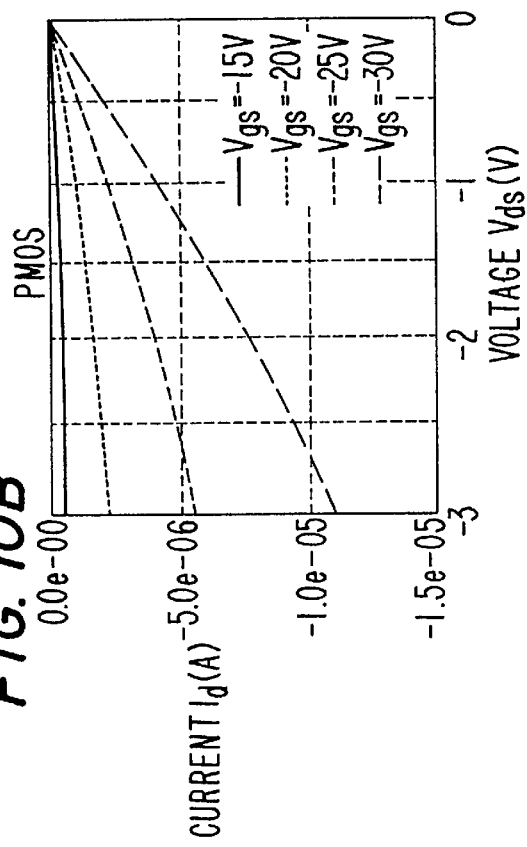
FIGS. 10A, 10B, 10C, and 10D are graphs depicting the device characteristics for an NMOS poly-$Si_{0.9}Ge_{0.1}$ thin film transistor and a PMOS poly-$Si_{0.9}Ge_{0.1}$ thin film transistor.
Figure 10B:
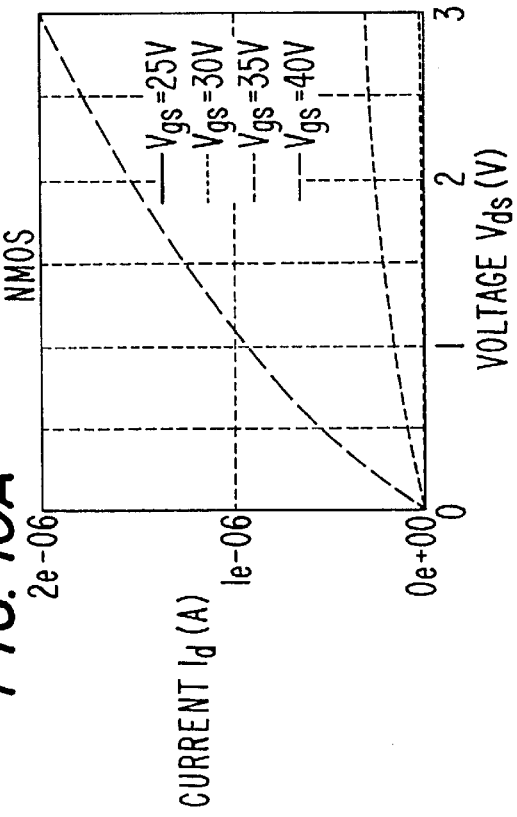
Figure 10C:
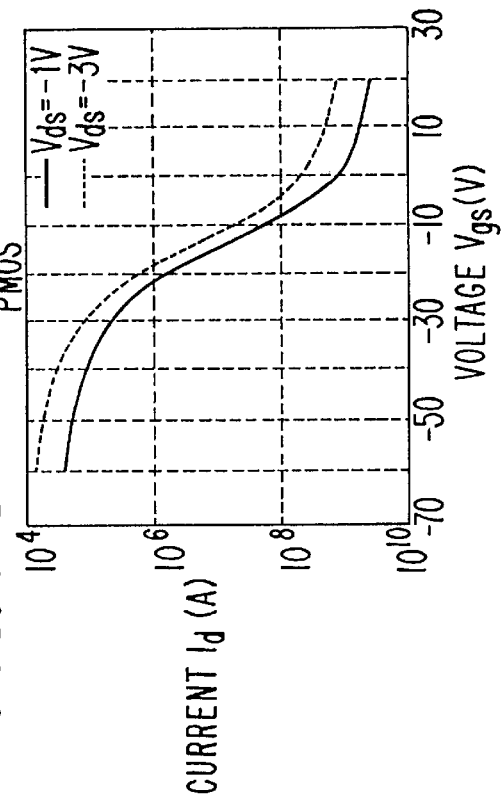
Figure 10D:
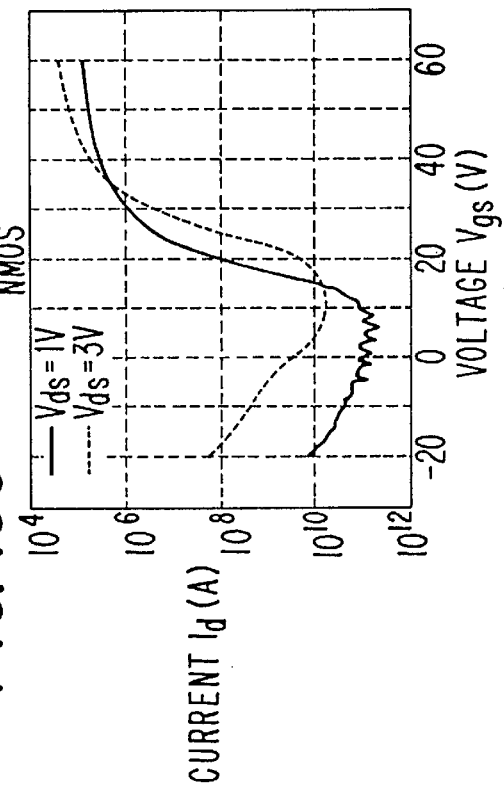
Figure 11A:
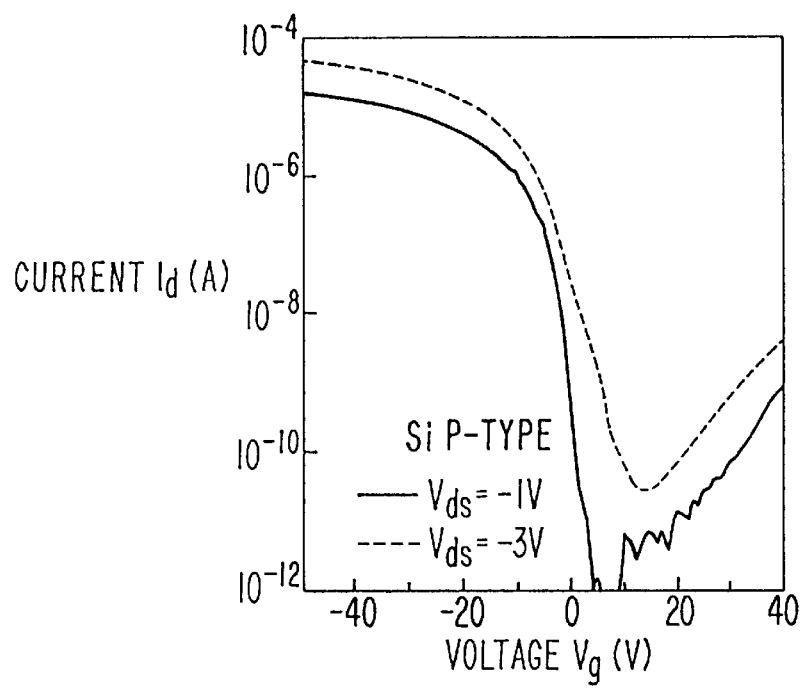
FIGS. 11A, 11B, 11C, and 11D are graphs depicting the device characteristics for an NMOS poly-$Si_{0.88}Ge_{0.12}$ thin film transistor and a PMOS poly-$Si_{0.88}Ge_{0.12}$ thin film transistor.
Figure 11B:
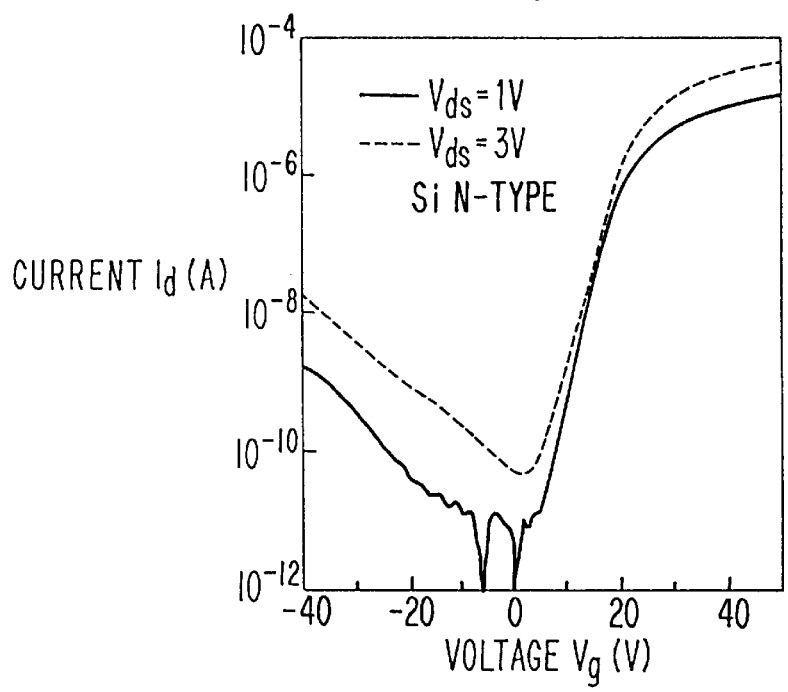
Figure 11C:
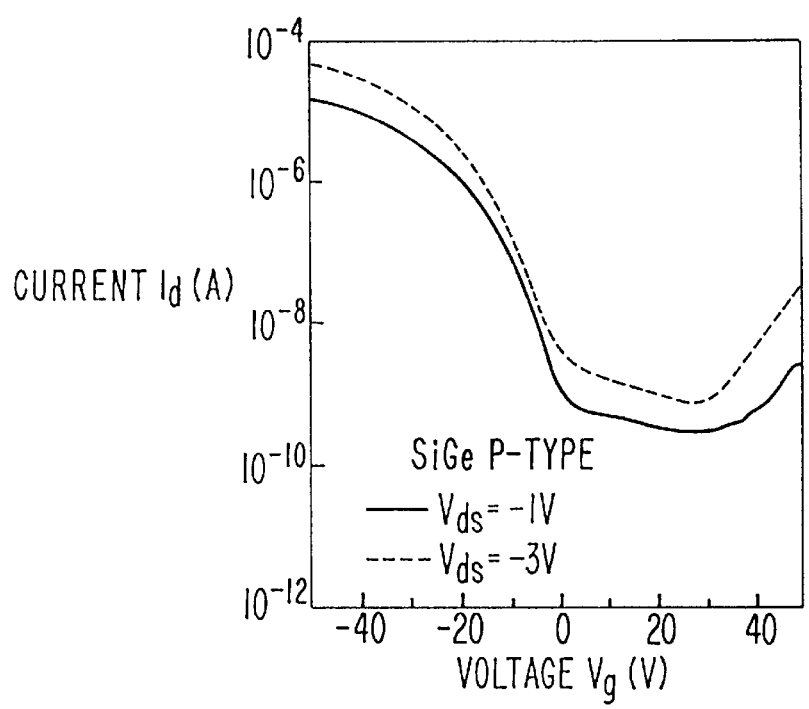
Figure 11D:
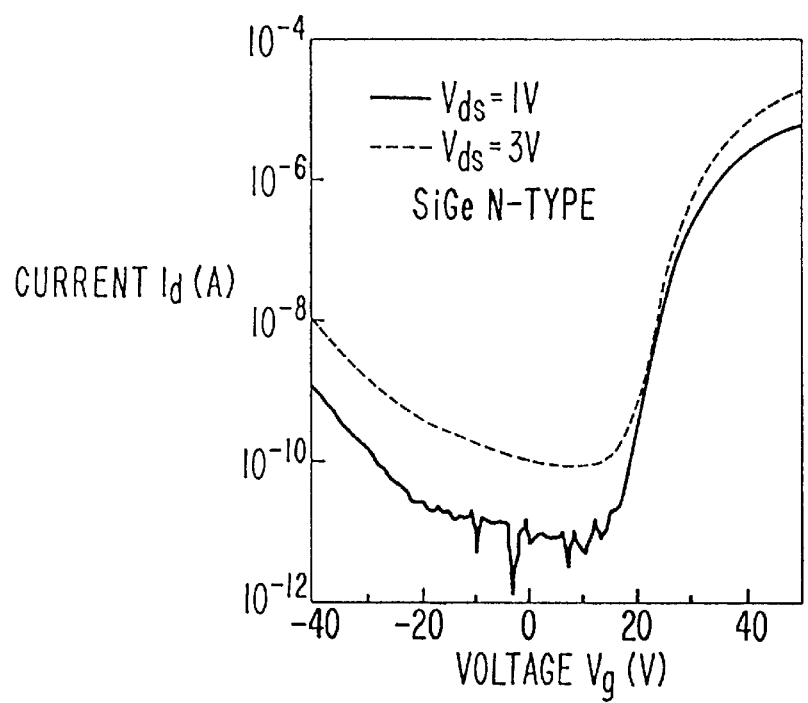

To evaluate field-effect mobilities and trap state densities in poly-$Si_{1-x}Ge_x$, top-gate poly-$Si_{1-x}Ge_x$ TFTs were fabricated and analyzed. Results for PMOS and NMOS poly-$Si_{0.90}Ge_{0.10}$ TFTs, prior to hydrogenation, with W=L=0.5$\mu$ are shown in FIGS. 9A and 9B, respectively. The transfer ($I_d$-$V_g$) characteristics are good, despite the lack of a final hydrogenation step. A summary of PMOS and NMOS poly-$Si_{0.90}Ge_{0.10}$ TFT characteristics is provided in Table 2.

TABLE 2

| Electrical parameter | p-MOS $V_{ds} = -1V$ | n-MOS $V_{ds} = 1V$ |
|---|---|---|
| Maximum $\mu_{FE}$ (cm$^2$/V-s) | 20 | 17 |
| Maximum $I_{on}/I_{off}$ ratio | $10^5$ | $10^6$ |
| Subthreshold slope (V/dec) | 5.33 | 2.89 |
| $I_{leak}$ (pA) | 500 | 10 |

Since the Hall effect results indicate superior bulk properties in poly-$Si_{1-x}Ge_x$ relative to poly-Si, it is believed that virtually all of the trap state density may be attributed to the poly-$Si_{1-x}Ge_x$/$SiO_2$ interface-related trap states as opposed to bulk poly-$Si_{1-x}Ge_x$ trap states. Consequently, the interface trap state density can be calculated from the measured subthreshold slope by the following equation:

$$S = \frac{kT}{q} \ln10(1 + qN_T^*/C_{ox})$$

where $N_T^*$ is the interface trap state density. In the case of an n-MOS TFT, subthreshold slopes are comparable for poly-Si and poly-$Si_{0.90}Ge_{0.10}$. However, for a p-MOS TFT, the subthreshold slope degrades drastically with the addition of 10% Ge. The estimated trap state density is 1.85e13 cm$^{-2}\cdot$eV$^{-1}$.

EXAMPLE 3

NMOS and PMOS TFTs were fabricated with dimensions down to L=W=0.5 $\mu$m. A summary of the process is shown in Table 3. Si wafers with 0.5 $\mu$m of thermally grown SiO$_2$ were used as the substrates for LPCVD deposition of 150 nm amorphous $Si_{0.9}Ge_{0.1}$ at 550° C. The $Si_{0.9}Ge_{0.1}$ films were then amorphized by Si$^+$ implantation at a dose of 2e15 cm$^{-2}$ and annealed in N$_2$ for 55 hours at 600° C. A gate insulator of 100 nm low-temperature oxide and a gate electrode of 300 nm poly-Si were deposited. Self-aligned source/drain implants consisted of a 2e15 cm$^{-2}$ dose of phosphorus for n-type and a 2e15 cm$^{-2}$ dose of boron for p-type. For source/drain dopant activation, p-channel devices were annealed for 3 hours, while n-channel devices were annealed for 65 hours, both in N$_2$ at 600° C. Finally, a 1 $\mu$m thick layer of Al-1%Si metallization was sputter-deposited and sintered for 20 minutes in forming gas with 15% H$_2$.

TABLE 3

1. 500 nm thermal isolation oxide
2. 150 nm $^1$L-PCVD poly-$Si_{0.9}Ge_{0.1}$ body
3. Si ion implantation: 2e15 cm$^{-2}$, 70 keV
4. solid-phase crystallisation: 600° C., Na, 55 hrs.
5. pattern active area
6. poly-$Si_{0.9}Ge_{0.1}$ plasma etch
7. 100 nm LTO gate insulator deposition
8. 150 nm poly-Si gate deposition
9. pattern gate
10. gate plasma etch
11. implant gate and source/drain regions:
    • n-type: P$^+$, 2e15 cm$^{-3}$, 110 keV
    • p-type: B$^+$, 2e15 cm$^{-3}$, 25 keV
12. Implant anneal as 600° C. in N$_2$ ambient:
    • n-type: 65 hrs.
    • p-type: 3 hrs.
13. 300 nm passivation LTO deposition
14. pattern contact holes
15. contact hole plasma etch
16. 1 $\mu$m Al—1% Si metallization
17. pattern metal
18. metal plasma etch
19. sinter at 400° C. for 20 min. in forming gas (15% H$_2$)

Improved $Si_{0.9}Ge_{0.1}$ TFT device characteristics were obtained for both the NMOS and PMOS TFTs, despite the lack of a hydrogenation process. Typical measured device characteristics are shown in FIGS. 10A, 10B, 10C, and 10D, and a summary of the TFT device characteristics is presented in Table 4. Similarly, FIGS. 11A, 11B, 11C, and 11D are graphs depicting the device characteristics for an NMOS poly-$Si_{0.88}Ge_{0.12}$ thin film transistor and a PMOS poly-$Si_{0.88}Geo_{0.12}$ thin film transistor. Tables 5 and 6 depict the device characteristics of a poly-Si TFT and a poly-$Si_{0.88}Ge_{0.12}$ TFT, respectively. For the n-channel devices, noticeable improvements in on-current, on/off current ratio ($10^6$), and field-effect mobility (17 cm$^2$/V-sec) are due to a significant reduction in the source/drain series resistance. However, some increased leakage current is observed, due to the reduced source/drain series resistance. As for the p-channel devices, although the field-effect mobility is improved (20 cm$^2$/V-sec), the on/off current ratio and subthreshold slope are not as good as previously reported values.

TABLE 4

| | NMOS | PMOS |
|---|---|---|
| Sheet Resistance (ohms/□) | 540 | 300 |
| Field-effect mobility $\mu_{FE}$ (cm$^2$/V-sec, $\|V_{ds}\|$ = 0.1V) | 17 | 20 |
| $I_{ON}/I_{OFF}$ ratio ($\|V_{ds}\|$ = 1V) | $10^6$ | $10^6$ |
| Threshold Voltage ($V_t \|V_{ds}\|$ = 1V) | 29V | −20V |
| Subthreshold Slope (V/dec, $\|V_{ds}\|$ = 1V) | 2.5 | 5 |

TABLE 5

| Si TFT: | p-MOS $V_{ds} = -1V$ | n-MOS $V_{ds} = 1V$ |
|---|---|---|
| $I_{on}/I_{off}$, max. | 2 × 10$^7$ | 2 × 10$^6$ |
| $V_T$ (V) | −5 | 20 |
| S Slope (V/dec) at $V_{ds} = \|0.1\|V$: | 1.2 | 2.8 |
| $\mu_{FE}$, max. $\left(\frac{cm^2}{V-s}\right)$ | 14.1 | 20.6 |

TABLE 6

| $Si_{0.88}Ge_{0.12}$ TFT: | p-MOS $V_{ds} = -1V$ | n-MOS $V_{ds} = 1V$ |
|---|---|---|
| $I_{on}/I_{off}$, max. | $6 \times 10^4$ | $9 \times 10^5$ |
| $V_T$ (V) | −18 | 28 |
| S Slope (V/dec) at $V_{ds} = |0.1|V$: | 4.5 | 2.5 |
| $\mu_{FE}$, max. $\left(\dfrac{cm^2}{V-s}\right)$ | 19.8 | 21.8 |

In this specification all references to Ge content and Si content are based on atomic %. All other proportions are given in weight %.

Obviously, numerous modifications and variations of the present invention are possible in light of the teachings. It is therefore to be understood that within the scope of the appended claims, the invention may be practiced otherwise than as specifically described herein.

What is claimed is:

1. A thin film transistor comprising an active region and a gate, wherein said active region comprises a poly-$Si_{1-x}Ge_x$ alloy material and a channel layer of silicon, in which the channel layer of silicon is interposed between the poly-$Si_{1-x}Ge_x$ alloy material and the gate and wherein x ranges from 0.05 to 0.40 atomic %.

2. The thin film transistor according to claim 1, wherein the thickness of the channel layer of silicon is 100 Å or less.

3. The thin film transistor according to claim 2, wherein the thickness of the channel layer of silicon is 50 Å or less.

4. The thin film transistor according to claim 1, wherein x ranges from 0.10 to 0.30 atomic %.

5. The thin film transistor according to claim 4, wherein x is 0.20 atomic %.

6. A thin film transistor comprising an active region, and a gate, wherein said active region comprises a poly-$Si_{1-x}Ge_x$ alloy material and a channel layer of silicon, in which the channel layer of silicon is interposed between the poly-$Si_{1-x}Ge_x$ alloy material and the gate, wherein x ranges from 0.05 to 0.40 atomic %, and wherein the thickness of the poly-$Si_{1-x}Ge_x$ layer ranges from 100 Å to 1500 Å.

7. The thin film transistor according to claim 6, wherein the thickness of the channel layer of silicon is 100 Å or less.

8. The thin film transistor according to claim 7, wherein the thickness of the channel layer of silicon is 50 Å or less.

9. The thin film transistor according to claim 6, wherein x ranges from 0.10 to 0.30 atomic %.

10. The thin film transistor according to claim 9, wherein x is 0.20 atomic %.

11. The thin film transistor according to claim 6, wherein the thickness of the poly-$Si_{1-x}Ge_x$ layer ranges from 100 Å to 1000 Å.

12. A thin film transistor comprising:
    an active region; and
    a single gate;
    wherein said single gate is the only gate of said transistor; and
    wherein said active region comprises;
        a poly-$Si_{1-x}Ge_x$ alloy material, and
        a channel layer of silicon,
        wherein said channel layer of silicon is interposed between said poly-$Si_{1-x}Ge_x$ alloy material and the gate, and
        wherein x ranges from 0.05 to 0.40 atomic %.

13. The thin film transistor according to claim 12, wherein the thickness of the channel layer of silicon is 100 Å or less.

14. The thin film transistor according to claim 13, wherein the thickness of the channel layer of silicon is 50 Å or less.

15. The thin film transistor according to claim 12, wherein x ranges from 0.10 to 0.30 atomic %.

16. The thin film transistor according to claim 15, wherein x is 0.20 atom %.

17. The thin film transistor according to claim 12, wherein the thickness of the poly-$Si_{1-x}Ge_x$ layer ranges from 100 Å to 1500 Å.

18. The thin film transistor according to claim 17, wherein the thickness of the poly-$Si_{1-x}Ge_x$ layer ranges from 100 Å to 1000 Å.

19. The thin film transistor according to claim 12, wherein said single gate is disposed between a substrate and said silicon channel layer.

20. The thin film transistor according to claim 12, wherein said single gate is disposed on the opposite side of said silicon channel layer from a substrate.

* * * * *